United States Patent [19]

Tanaka et al.

[11] Patent Number: 5,057,396

[45] Date of Patent: Oct. 15, 1991

[54] PHOTOSENSITIVE MATERIAL HAVING A SILICON-CONTAINING POLYMER

[75] Inventors: Akinobu Tanaka, Atsugi; Masazumi Hasegawa, Shin Nanyo, both of Japan

[73] Assignees: Tosoh Corporation, Yamaguchi; Nippon Telegraph and Telephone Corporation, Tokyo, both of Japan

[21] Appl. No.: 410,573

[22] Filed: Sep. 21, 1989

[30] Foreign Application Priority Data

Sep. 22, 1988 [JP] Japan .............................. 63-236299

[51] Int. Cl.$^5$ .............................................. G03C 5/00
[52] U.S. Cl. .................................... 430/270; 430/313; 430/197; 528/31
[58] Field of Search ............... 430/270, 326, 325, 313, 430/197; 528/31

[56] References Cited

U.S. PATENT DOCUMENTS

| | | | |
|---|---|---|---|
| 3,969,543 | 7/1976 | Roberts et al. | 430/919 |
| 4,507,384 | 3/1985 | Morita et al. | 430/270 |
| 4,600,685 | 7/1986 | Kitakohji et al. | 430/270 |
| 4,657,843 | 4/1987 | Fukuyama et al. | 430/270 |
| 4,702,990 | 10/1987 | Tanaka et al. | 430/197 |
| 4,722,881 | 2/1988 | Ueno et al. | 430/270 |

*Primary Examiner*—Charles L. Bowers, Jr.
*Assistant Examiner*—John S. Y. Chu
*Attorney, Agent, or Firm*—Sughrue, Mion, Zinn, Macpeak & Seas

[57] ABSTRACT

A silicon-containing polymer comprising repeating units of silicon-containing cyclic compound, represented by a general formula (I)

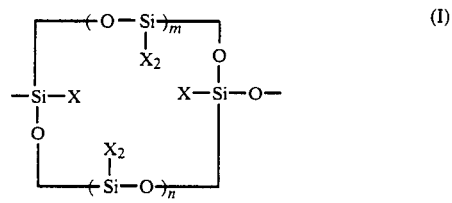

(wehrein m and n are positive integers including 0, respectively, however m+n>0, and X is any of alkyl group, alkoxy group, phenyl group, naphthyl group, substituted phenyl group and substituted naphthyl group or a mixture of these, and the substituent of said substituted phenyl group or substituted naphthyl group indicates any of halogen atom, halogenated alkyl group, amino group, aminoalkyl group and nitro group or a mixture of these), and a photosensitive material containing said silicon-containing polymer are disclosed.

5 Claims, 2 Drawing Sheets

29Si-NMR chart of hexaphenylcyclotrisiloxane

FD-MS chart $^{29}$Si-NMR chart said polymer $^{13}$C-NMR chart of said polymer

PHOTOSENSITIVE MATERIAL HAVING A SILICON-CONTAINING POLYMER

BACKGROUND OF THE INVENTION

The present invention relates to a novel silicon-containing polymer and a novel photosensitive material containing siloxane linkages, which is a material for a resist having a photosensitive group responsive to electron rays, X-rays, UV light and deep UV light used when producing a semiconductor integrated circuit and which is also usable as a layer-insulation film or a protective film.

The silicon-containing polymers are used in a variety of fields for the reasons that they exhibit excellent heat resistance and cold resistance, that the electric characteristics thereof are stable over a wide range of temperature, and the like. Moreover, silicon-based polymers provided with photosensitive group have been developed recently and the uses are spreading out as electronic materials, too.

In the electronic field, particularly in the production of semiconductors (integrated circuits), the fine processing of substrates has become more complicated and higher precision has been requested as the high integration progresses. Accompanying with this, the technique for performing the fine processing on a scale of submicron on a substrate with differences in levels has become problematic and various methods have been contrived. As one of them, the two-layer resist technique used silicon-based resist as a top layer was proposed, which is particularly spotlighted recently. This technique will be explained.

A resin or resist having resistance to halogen gas is spin-coated onto bottom layer, which is subject to soft- or hard-baking. Then, a silicon-based resist is spin-coated onto the top layer. Using an exposure device, the top layer resist is exposed to light and only the top layer is developed. Then, making the pattern area of the top layer resist as a mask, the bottom layer resist is etched with $O_2$ gas plasma. Finally, making the bottom layer resist as a mask, the substrate is etched with halogen gas.

The functions to be requested for the top layer resist are as follows:

(1) To be excellent in the resistance to $O_2$ plasma.
(2) To be excellent in the flatness.
(3) To have high glass transition temperature.
(4) To have high resolution.
(5) To have high sensitivity.

The silicon-containing resist materials are excellent in the resistance to $O_2$ plasma and some resist materials using them are known. As representatives, a method to attach a silyl group directly or indirectly to the benzene rings of Novolak resin or polystyrene, a method to utilize the polysilane linkage, and, in particular, recently, a method to utilize a ladder polymer (silsesquioxane linkage) are proposed.

In the case of the type with attached silyl group directly or indirectly to the benzene rings, however, a problem that the resistance to $O_2$ plasma is insufficient exists because of that the content of Si is low and Si is introduced to a side chain. Moreover, in the case of polysilane type, poor coating property and stability are generally pointed out though the content of Si may be increased depending on the kind of compounds. Furthermore, in the case of silsesquioxane type polymers, there is a problem that the sensitivity is not enough though the resistance to $O_2$ plasma is excellent.

As described above, it is the status quo that the resist materials being excellent in the resistance to $O_2$ plasma and the flatness and having all of high Tg, high resolution and high sensitivity have not ever been developed.

The invention was made to dissolve the problems as above and the purpose thereof is to provide a novel silicon-containing polymer and a photosensitive material using the same, which is excellent in the resistance to $O_2$ plasma and the flatness and which has high Tg, high resolution and high sensitivity.

As a result of diligent studies in such background, the inventors have found that, by using a polymer having a single siloxane cyclic compound as a repeating unit or a copolymer having various siloxane cyclic compounds as repeating units, a resist material being highly sensitive, highly flat and excellent in the resistance to $O_2$ plasma and yet having high Tg can be obtained, leading to the completion of the invention.

SUMMARY OF THE INVENTION

Said silicon-containing polymer comprising repeating units of silicon-containing cyclic compound is represented by a general formula (I).

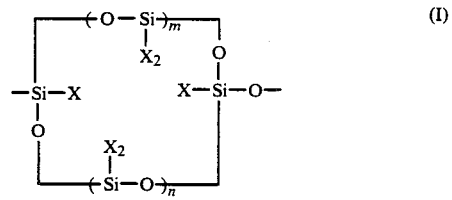

(wherein m and n are positive integers including 0, respectively, however $m+n>0$, and X is any of alkyl group, alkoxy group, phenyl group, naphthyl group, substituted phenyl group and substituted naphthyl group or a mixture of these, and the substituent of said substituted phenyl group or substituted naphthyl group indicates any of halogen atom, halogenated alkyl group, amino group, aminoalkyl group and nitro group or a mixture of these).

DETAILED DESCRIPTION OF THE INVENTION

Figure 1:
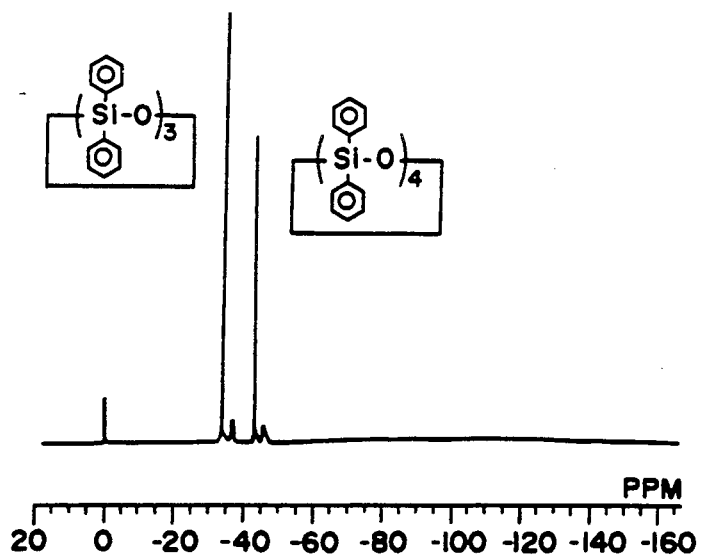
FIG. 1 shows a $^{29}$Si-NMR chart of hexaphenylcyclotrisiloxane being a starting raw material in Production example 2 of the invention.

The alkyl group being X in the general formula (I) is not particularly restricted. In the case of chain alkyl, however, it is each group of, for example, methyl, ethyl, propyl, butyl, pentyl, hexyl, octyl, decyl, dodecyl, vinyl, propenyl, butenyl, pentenyl, hexenyl, octenyl, decenyl, dodecenyl, or the like, and, in the case of branched alkyl, it is each group of, for example, sec-propyl, sec-butyl, t-butyl, 2-methylpropyl, 2-methylbutyl, neopentyl, 1-methylpentyl, 2-methylpentyl, 4-methylpentyl, 2-ethylhexyl or the like. Part of hydrogens in said alkyl group may be substituted by halogen atom such as F, Cl, Br or I and/or by phenyl, naphthyl, substituted phenyl or substituted naphthyl group. As a substituent in said substituted phenyl or substituted naphthyl, for example, chlorine, fluorine, bromine, nitro group, alkyl group, amino group or the like can be mentioned. Moreover, in the case of the cyclic alkyl, each group of cyclopropyl, cyclopropenyl, cyclobutyl, cyclobutenyl, cyclopentyl, cyclopentenyl, cyclohexyl, cyclohexenyl, cyclooctyl, cyclooctenyl or the like can be mentioned. Moreover, also when X is alkoxy group, this is not particularly restricted and, for example, methoxy, ethoxy, propoxy, butoxy, pentoxy, phenoxy or the like can be mentioned.

Since the resist material of the invention has a siloxane structure containing an Si group on the main chain of the polymer and the content of Si is also high, it is very high in the resistance to $O_2$ plasma and further, because of cyclic ring structure, it has a high Tg. Of course, when desiring higher Tg, such one can easily be obtained by introducing phenyl group or naphthyl group to the side chain of an Si group.

As the methods to give the photosensitivity, there is a method to allow an Si group directly or a side chain thereof in the polymer of the invention to have a compound to which a photosensitive group, for example, halogenated alkyl group, aminoalkyl group or the like is introduced, or a method to add a photosensitive agent to the polymer of the invention.

For the method of producing siloxane polymer of the invention represented by the general formula (I), there are two ways to start: from monomer and cyclic ring. For example, when starting from monomer, the following reactions are utilized.

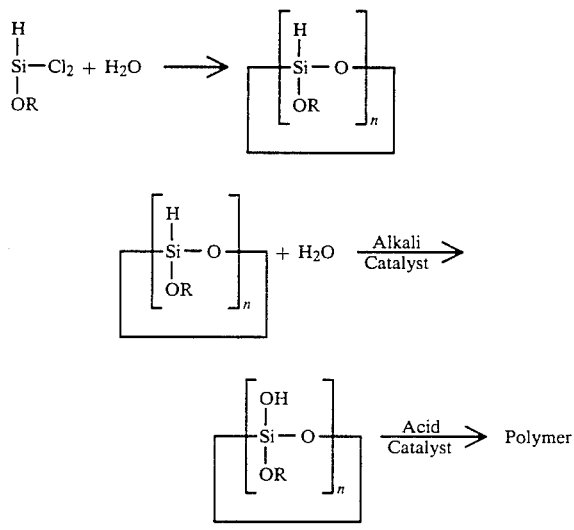

(R: Arbitrary substituent, n: Positive integer)

Moreover, when starting from cyclic ring, the rearrangement due to Lewis acid or the dissociation reaction of Si-C is utilized. For example,

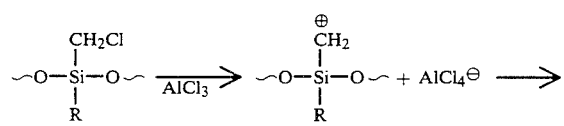

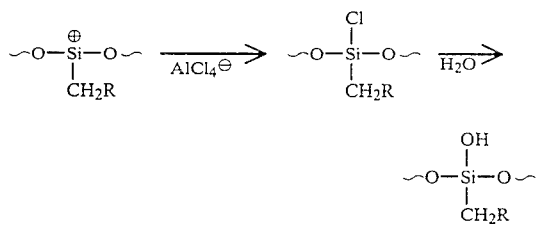

successively, using the reaction $2SiOH \rightarrow Si-O-Si$, the polymerization is contemplated (R: arbitrary substituent).

Furthermore, when using cyclic ring containing phenyl group as a starting raw material, the following reaction is utilized.

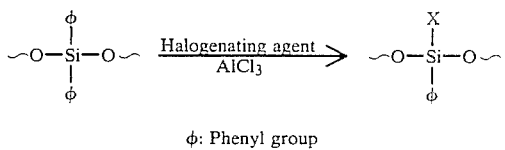

φ: Phenyl group

In succession, $H_2O$ or alcohol is allowed to react to convert to SiOH or SiOR' (R': arbitrary substituent). As a halogenating agent to be used here, acids such as H—Hal (Hal: halogen atom), $Hal_2$, alkyl halide, thionyl halide, sulfonyl halide or the like can be mentioned.

By adding the photosensitive agent or introducing the photosensitive group to the polymer of the invention produced utilizing the reactions aforementioned, the polymer becomes usable as a photosensitive material.

For introducing the photosensitive group, there is a method to make a cyclic ring by using a compound possible to become the photosensitive group, for example, Si compound having a double bond such as $H_2C=CH-CH_2-Si$ for the side chain of Si. Or, after producing the polymer of the invention, the photosensitive group may be introduced to the side chain of Si or the photosensitive agent may be added. Further, if necessary, coupling of SiOH or SiOR" (R": alkyl group or phenyl group) contained in the polymer of the invention may be conducted with silane coupling agent. Still more, if need be, a crosslinking agent, sensitizer or the like commonly used may be added.

In the following, the invention will be illustrated in more detail based on examples, but the invention is not confined to these.

PRODUCTION EXAMPLE 1

To 100 g of ether cooled with ice were added 10 g of φ $SiHCl_2$. Then, a small amount of hydrochloric acid (35% aqueous solution) and 50 g of chloromethyl methyl ether were added under stirring and the mixture was stirred for about 30 minutes under cooling with ice. After the completion of reaction, said reaction product was added dropwise into a large amount of methanol solution to produce the precipitates. Two peaks were recognized on analyzing the precipitates with silicon NMR. When fractionating with GPC to analyze, these precipitates were confirmed to be a mixture of two kinds of compounds, i.e. trisilylcyclosiloxane and tetrasilylcyclosiloxane. Then, 5 g of these precipitates were dissolved into 100 g of THF (tetrahydrofuran)

solution containing approximately 0.5% by weight of water and triethylamine was added in small amount, which was violently stirred. Thereafter, the reaction liquor was added dropwise into benzene to precipitate the cyclosiloxane compound. When taking H-NMR of these precipitates, a peak originating from SiOH was identified. Successively, for the chloromethylation, 5 g of the precipitates previously obtained were added into a solution of 100 g of methylal and 8 g of thionyl chloride, which was adjusted to $-20°$ C. while stirring. Then, Lewis acid (e.g. $FeCl_3$) was added in small amount to allow the polymerization reaction and the chloromethylating reaction to progress concurrently. After the reaction for about 20 hours, this reaction product was added dropwise into a large amount of solution of 0° C. comprising methanol and water (1:1) to precipitate the polymer. When determining the molecular weight after drying, it was found to be MW$\approx$10000 (in terms of polystyrene) and the content of Cl was 4.1 % by weight.

EXAMPLE 1

To 45 g of DIBK (dibutyl ketone) were added 5 g of the polymer of Production example 1, which was enough stirred and completely dissolved. Then, this was filtered through a filter with 0.2 $\mu$m to make up a resist solution. Following this, OFPR-800 (photoresist made by Tokyo Oka Co.) was coated onto a silicon substrate with 3 in. so the thickness became 1 $\mu$m, which was baked for about 30 minutes at 200° C. in an oven. After baking, said resist solution was coated while adjusting the number of revolution of the spin coater so the thickness became 0.2 $\mu$m. After baking again for 20 minutes at 80° C., a picture was drawn with an electron ray exposure device. Next, the development was performed with a solution of 1-methoxy-2-propanol/di-n-butyl ether=5/2. The sensitivity at this time was 12 $\mu$C/cm$^2$ at an area of the rate of residual resist film being 50%. Successively, the etching with $O_2$ gas was performed by the use of a dry etching device (RIE).

| Etching conditions: | |
|---|---|
| Gas flow rate | 40 SCCM |
| RF power | 125 W |
| $O_2$ pressure | 40 m Torr |
| Etching speed | |
| Resist of the invention | 30 Å/min |
| OFPR-800 | 2000 Å/min |

As above, the resist of the invention was confirmed to be excellent in the resistance to $O_2$ plasma. When measuring the resolution with an electron microscope, a gap pattern with a line width of 3 $\mu$m and a space width of 0.2 $\mu$m was resoluted distinctly.

EXAMPLE 2

The resist prepared in Example 1 was spin-coated onto a silicon wafer while adjusting the number of revolution so the thickness became 0.35 $\mu$m. Thereafter, this was baked for 20 minutes at 80° C. in an oven and drawing and development were made by the same technique as that in Example 1. Thereafter, when baking for 30 minutes at 80° C. or 160° C., the line width of pattern was not changed at either temperature. That is to say, it could be confirmed that the flow of resist did not take place even if baking at high temperature.

PRODUCTION EXAMPLE 2

To 80 g of methylal were added 6 g of commercial hexaphenylcyclotrisiloxane (when determined with silicon NMR, two peaks were detected at 33-34 ppm and 43 ppm (see FIG. 1)). Then, when conducting FD-MS measurement (electrolytically eliminated ion-mass spectrum), this was confirmed to be a mixture of a compound with a mass of 594 originating from hexaphenylcyclotrisiloxane and that with a mass of 792 originating from octaphenylcyclotetrasiloxane. Further, after adding 10 g of thionyl chloride, the mixture was enough stirred and the temperature of the solution was adjusted so as to become $-20°$ C. Next, a small amount of $FeCl_3$ catalyst was added to concurrently progress the polymerization and the chloromethylating reaction for 20 hours. After the completion of reaction, this reaction product was added dropwise into a solution of methanol: water = 1:1 to precipitate the polymer. When measuring the molecular weight with GPC after drying, this was found to be MW = 39000 and the content of Cl was 6.8% by weight.

Figure 2:
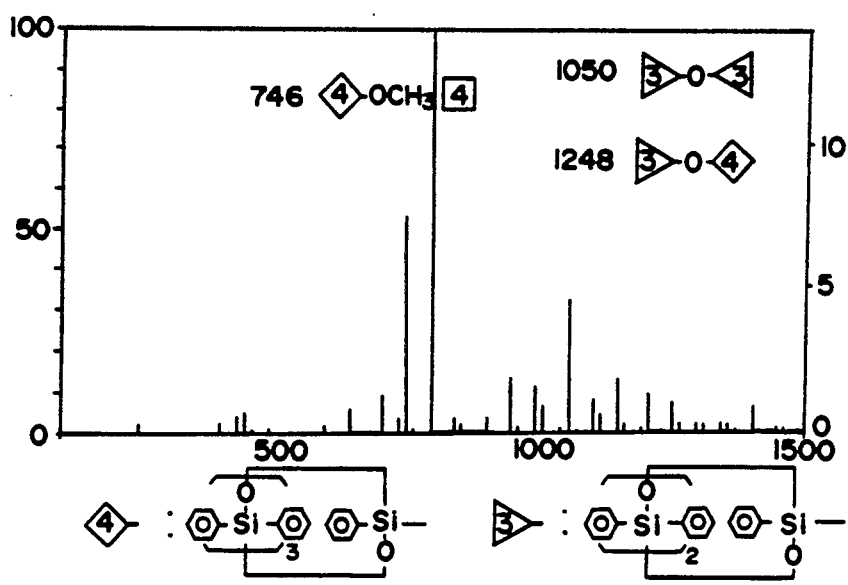
FIG. 2 shows a FD-MS chart of the product at 10 minutes after the initiation of polymerization reaction in the same Production example 2.
Figure 3:
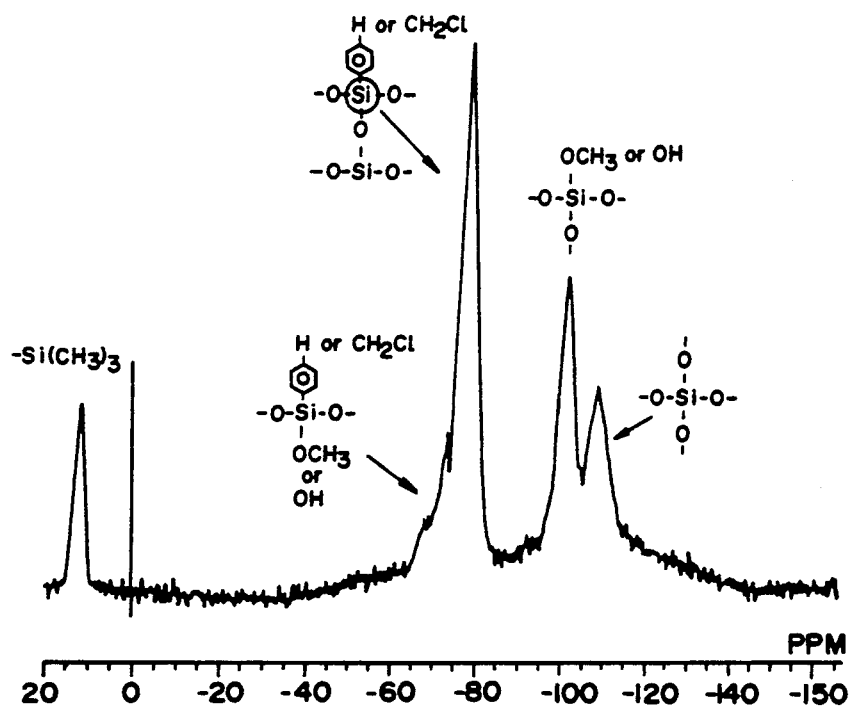
FIG. 3 and FIG. 4 show a $^{29}$Si-NMR chart and a $^{13}$C-NMR chart of product, respectively, after the completion of polymerization reaction in the same Production example 2.
Figure 4:
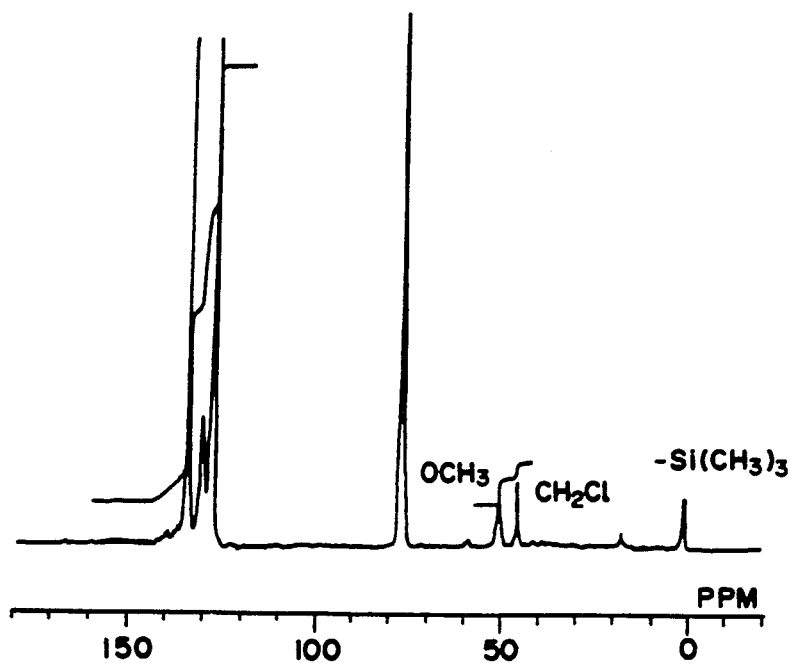

In this polymerization procedure, sampling was made at 10 minutes after the addition of catalyst to conduct FD-MS measurement. Results are shown in FIG. 2. Further, results of silicon NMR, $^{13}$C-NMR and elemental analysis of a sample after the completion of reaction are shown in FIG. 3, FIG. 4 and Table 1, respectively.

From the results of analysis above, the structure of the present polymer is assumed as follows:

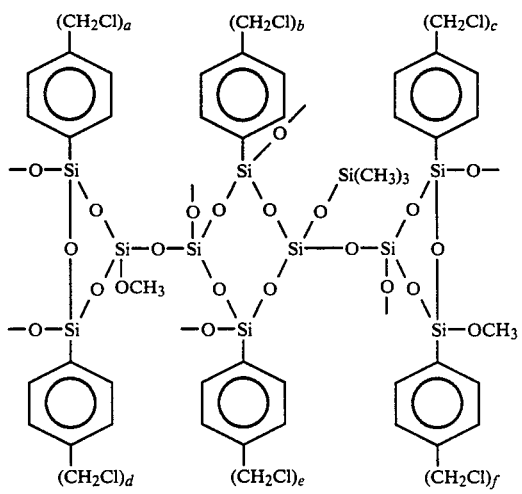

a + b + c + d + e + f = 2 or 3

TABLE 1

| | Results of elemental analysis | | | |
|---|---|---|---|---|
| | C | H | Si | Cl |
| Polymer | 42.7% | 3.6% | 24.7% | 6.8% |

EXAMPLE 3

Except that 3.5 g of polymer in Production example 2 were dissolved into 48 g of DIBK, entirely same procedure was used as in Example 1 and 2.
Sensitivity
   Very high sensitivity was obtained as proved by 50% rate of residual film = 2.8 $\mu$C/cm$^2$.
Etching speed Resist of the invention . . . 20 Å/min
OFPR-800 . . . 2000 Å/min
Resolution
Distinct gap pattern of L/S=3 μm/0.2 μm was obtained.
Test for heat resistance
Even when post-baking was performed for 30 minutes at 80° C. or 160° C., the line width of the pattern was not changed.

EXAMPLE 4

Into 45 g of DIBK were dissolved 3.5 g of resin in Production example 2 and 1.2 g of 4,4'-diazidobenzophenone, which was filtered through a filter with 0.2 μm to obtain a resist solution.

OFPR-800 was coated onto a wafer with 3 in. so the film thickness became 1.2 μm, which was baked for 30 minutes at 200° C. Next, the resist of the invention was coated at 0.2 μm. Closely contacting exposure was conducted using PLA-521F (deep UV light). Thereafter, etching was performed under same conditions as in Example 1.

Sensitivity
Very high sensitivity was confirmed also to the deep UV light as proved 70% rate of residual film=2.2 L.I.
Etching speed
Resist of the invention . . . 25 Å/min
OFPR-800 . . . 2000 Å/min
As above, the resist of the invention was confirmed to have sufficient resistance to $O_2$ even when adding photocrosslinking agent.
Resolution
Distinct pattern of L/S=0.5 μm/0.5 μm was obtained.

As illustrated above, the photosensitive material using a novel silicon-containing polymer having a silicon-containing cyclic compound as a repeating unit in accordance with the invention is very high-sensitive to electron rays, X-rays, deep UV light and UV light. Moreover, it has high etching resistance to $O_2$ because the main chain is a siloxane linkage and the content of Si is high, it is also excellent in the heat resistance because of a cyclic ring, and further it has high resolution. It is therefore suitable for the production of semiconductor integrated circuit elements such as super LSI elements.

What is claimed is:

1. A photosensitive material containing silicon-containing polymer comprising repeating units of silicon-containing cyclic compound, represented by a general formula (II)

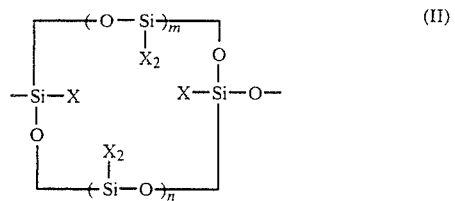

wherein m and n are positive integers including 0, respectively, however m+n>0, and X is any of alkyl group, alkoxy group, phenyl group, naphthyl group, substituted phenyl group and substituted naphthyl group or a mixture of these, and the substituent of said substituted phenyl group or substituted naphthyl group indicates any of halogen atom, halogenated alkyl group, amino group, aminoalkyl group and nitro group or a mixture of these.

2. The photosensitive material according to claim 1, wherein m+n is any of 1 to 4.

3. The photosensitive material according to claim 1, wherein it comprises a mixture of any or all of compounds m+n being 1 to 4.

4. The photosensitive material, wherein a photosensitive group is attached to Si group directly or to side chain thereof in the high-molecular material according to claim 1.

5. The photosensitive material, wherein a photosensitive agent is added to the high-molecular material according to claim 1.

* * * * *